(12) United States Patent
Deutsch et al.

(10) Patent No.: US 6,691,618 B2
(45) Date of Patent: Feb. 17, 2004

(54) CHEMICAL IMAGING OF A LITHOGRAPHIC PRINTING PLATE

(75) Inventors: Albert S. Deutsch, Somers, NY (US); Lawrence D. David, Amherst, NH (US); David B. West, Carlisle, MA (US)

(73) Assignee: Pisces-Print Imaging Sciences, Inc., Nashua, NH (US)

( * ) Notice: Subject to any disclaimer, the term of this patent is extended or adjusted under 35 U.S.C. 154(b) by 0 days.

(21) Appl. No.: 10/057,152

(22) Filed: Oct. 25, 2001

(65) Prior Publication Data

US 2002/0104455 A1 Aug. 8, 2002

Related U.S. Application Data

(60) Continuation-in-part of application No. 09/941,304, filed on Aug. 29, 2001, and a continuation-in-part of application No. 09/941,323, filed on Aug. 29, 2001, now Pat. No. 6,523,471, which is a division of application No. 09/566,455, filed on May 8, 2000, now Pat. No. 6,315,916.
(60) Provisional application No. 60/281,742, filed on Apr. 3, 2001, provisional application No. 60/281,743, filed on Apr. 3, 2001, and provisional application No. 60/281,744, filed on Apr. 3, 2001.

(51) Int. Cl.[7] .................................................. B41C 1/10
(52) U.S. Cl. ......................................... 101/465; 347/96
(58) Field of Search ............................... 101/453, 456, 101/457, 462, 463.1, 465, 466, 467; 430/302; 347/96, 100, 101, 102, 105, 106

(56) References Cited

U.S. PATENT DOCUMENTS

| 2,063,631 A | 12/1936 | Schmidt et al. ............. 534/564 |
| 2,667,415 A | 1/1954 | Neugebauer et al. ....... 430/302 |
| 2,679,498 A | 5/1954 | Seven et al. ................ 534/564 |
| 3,050,502 A | 8/1962 | Mellan ...................... 528/236 |
| 3,163,633 A | 12/1964 | Steppan et al. ............. 534/564 |
| 3,227,074 A | 1/1966 | Lareau ....................... 101/132 |
| 3,311,605 A | 3/1967 | Steppan et al. ............. 534/564 |
| 3,406,159 A | 10/1968 | Steppan et al. ............. 534/564 |
| 3,479,185 A | 11/1969 | Chambers, Jr. .............. 96/84 |
| 3,561,961 A | 2/1971 | Blake ........................ 430/264 |
| 3,615,567 A | 10/1971 | Wilson ....................... 96/90 |
| 3,716,390 A | 2/1973 | Whitby ....................... 216/41 |
| 3,785,825 A | 1/1974 | Deutsch et al. .............. 96/75 |

(List continued on next page.)

FOREIGN PATENT DOCUMENTS

| GB | 1 431 462 | 4/1976 | |
| JP | 06008413 A | 1/1994 | .............. B41J/2/01 |
| JP | 06014165 A | 1/1994 | ............ H04N/1/23 |
| JP | 06166162 A | 6/1994 | .............. B41C/1/00 |
| JP | 07108667 A | 4/1995 | .............. B41C/1/10 |
| JP | 07205563 A | 8/1995 | |
| JP | 08290543 A | 11/1996 | .............. B41F/7/02 |
| JP | 08324145 A | 12/1996 | .............. B41N/1/14 |
| JP | 09029926 A | 2/1997 | .............. B41C/1/10 |
| JP | 09058144 A | 3/1997 | .............. B41N/1/14 |
| JP | 09118003 A | 5/1997 | .............. B41C/1/10 |
| JP | 09258458 A | 10/1997 | .............. G03F/7/30 |
| JP | 10010709 A | 1/1998 | .............. G03F/7/00 |
| JP | 10016176 A | 1/1998 | .............. B41C/1/10 |

(List continued on next page.)

OTHER PUBLICATIONS

J. Konar, Light Sensitive Systems, 1965, J. Wiley & Sons, NY, pp. 338–353.

Allen et al., Eur. Polym. J., vol. 21, No. 10, 1985, pp. 841–848.

*Primary Examiner*—Stephen R. Funk
(74) *Attorney, Agent, or Firm*—Hayes Soloway P.C.

(57) ABSTRACT

A process for imaging a lithographic printing plate having a presensitizing coating. An ink jet printer is used to apply imagewise micro drops of an insolubilizing solution that insolubilizes exposed areas of the coating. The latent image is then developed. The process works with conventional, commercially available developing processors.

24 Claims, 5 Drawing Sheets

U.S. PATENT DOCUMENTS

| | | | |
|---|---|---|---|
| 3,849,392 A | 11/1974 | Steppan | 534/560 |
| 3,870,435 A | 3/1975 | Watanabe et al. | 117/36.2 |
| 3,910,187 A | 10/1975 | Cords | 101/450 |
| 4,003,312 A | 1/1977 | Gunther | 101/466 |
| 4,007,047 A | 2/1977 | Kaplan et al. | 96/36 |
| 4,104,070 A | 8/1978 | Moritz et al. | 96/36 |
| 4,186,069 A | 1/1980 | Muzyczko et al. | 430/175 |
| 4,224,398 A | 9/1980 | Muzyczko et al. | 430/175 |
| 4,258,367 A | 3/1981 | Mansukhani | 346/1.1 |
| 4,273,851 A | 6/1981 | Muzyczko et al. | 430/175 |
| 4,288,520 A | 9/1981 | Sprintschnik et al. | 430/169 |
| 4,292,388 A * | 9/1981 | Ikeda et al. | 430/162 |
| 4,299,907 A | 11/1981 | Burkle et al. | 430/175 |
| 4,303,924 A | 12/1981 | Young, Jr. | 346/1.1 |
| 4,356,254 A | 10/1982 | Takahashi et al. | 430/296 |
| 4,382,262 A | 5/1983 | Savit | 346/1.1 |
| 4,436,804 A | 3/1984 | Walls | 430/157 |
| 4,443,820 A | 4/1984 | Mutoh et al. | 358/296 |
| 4,511,640 A | 4/1985 | Liu | 430/157 |
| 4,668,533 A | 5/1987 | Miller | 427/98 |
| 4,833,486 A | 5/1989 | Zerillo | 346/1.1 |
| 4,857,143 A | 8/1989 | Glenning et al. | 156/668 |
| 4,917,988 A | 4/1990 | Koizumi et al. | 430/169 |
| 4,927,741 A | 5/1990 | Garth et al. | 430/309 |
| 5,032,216 A | 7/1991 | Felten | 156/628 |
| 5,114,744 A | 5/1992 | Cloutier et al. | 427/96 |
| 5,154,121 A | 10/1992 | Schneider | 101/401.1 |
| 5,156,089 A | 10/1992 | McCue et al. | 101/128.4 |
| 5,209,814 A | 5/1993 | Felten et al. | 156/628 |
| 5,270,078 A | 12/1993 | Walker et al. | 427/264 |
| 5,270,368 A | 12/1993 | Lent et al. | 524/236 |
| 5,312,654 A | 5/1994 | Arimatsu et al. | 427/511 |
| 5,316,892 A | 5/1994 | Walls et al. | 430/309 |
| 5,431,723 A | 7/1995 | Bermes et al. | 106/22 K |
| 5,466,653 A | 11/1995 | Ma et al. | 503/200 |
| 5,495,803 A | 3/1996 | Gerber et al. | 101/401.1 |
| 5,501,150 A | 3/1996 | Leenders et al. | 101/466 |
| 5,514,522 A | 5/1996 | Fitzgerald et al. | 430/284.1 |
| 5,516,620 A | 5/1996 | Cheng et al. | 430/138 |
| 5,556,924 A | 9/1996 | Fitzgerald et al. | 525/293 |
| 5,599,650 A | 2/1997 | Bi et al. | 430/273.1 |
| 5,607,816 A | 3/1997 | Fitzgerald et al. | 430/271.1 |
| 5,620,822 A | 4/1997 | Kato et al. | 430/49 |
| 5,621,448 A | 4/1997 | Oelbrandt et al. | 347/96 |
| 5,637,426 A | 6/1997 | Uchikawa | 430/9 |
| 5,662,039 A | 9/1997 | Watanabe et al. | 101/116 |
| 5,677,108 A | 10/1997 | Chia et al. | 430/273.1 |
| 5,677,110 A | 10/1997 | Chia et al. | 430/302 |
| 5,688,627 A | 11/1997 | Deutsch | 430/157 |
| 5,695,908 A | 12/1997 | Furukawa | 430/205 |
| 5,738,013 A | 4/1998 | Kellett | 101/463.1 |
| 5,750,314 A | 5/1998 | Fromson et al. | 430/302 |
| 5,795,698 A | 8/1998 | Fitzgerald et al. | 430/281.1 |
| 5,811,220 A | 9/1998 | Cheng et al. | 430/302 |
| 5,819,653 A | 10/1998 | McCue | 101/128.21 |
| 5,820,932 A | 10/1998 | Hallman et al. | 427/261 |
| 5,849,066 A | 12/1998 | Kellett | 106/31.13 |
| 5,849,462 A | 12/1998 | Li et al. | 430/283.1 |
| 5,852,975 A | 12/1998 | Miyabe et al. | 101/463.1 |
| 5,857,410 A | 1/1999 | Watanabe et al. | 101/116 |
| 5,878,662 A | 3/1999 | McCue | 101/128.4 |
| 5,878,664 A | 3/1999 | Hartka | 101/216 |
| 5,889,084 A | 3/1999 | Roth | 523/161 |
| 5,900,345 A | 5/1999 | Platzer et al. | 430/156 |
| 5,910,395 A | 6/1999 | Li et al. | 430/302 |
| 5,925,497 A | 7/1999 | Li et al. | 430/278.1 |
| 5,966,154 A | 10/1999 | DeBoer | 347/82 |
| 5,970,873 A | 10/1999 | DeBoer et al. | 101/466 |
| 5,992,322 A | 11/1999 | Fromson et al. | 101/457 |
| 5,997,993 A | 12/1999 | Bi et al. | 428/195 |
| 6,014,931 A | 1/2000 | Fromson et al. | 101/465 |
| 6,019,045 A | 2/2000 | Kato et al. | 101/466 |
| 6,020,397 A | 2/2000 | Matzinger | 523/160 |
| 6,025,022 A | 2/2000 | Matzinger | 427/256 |
| 6,027,857 A | 2/2000 | Li et al. | 430/283.1 |
| 6,044,762 A | 4/2000 | DeBoer et al. | 101/466 |
| 6,131,514 A | 10/2000 | Simons | 101/466 |
| 6,187,380 B1 | 2/2001 | Hallman et al. | 427/261 |
| 6,315,916 B1 | 11/2001 | Deutsch et al. | 216/83 |
| 6,403,277 B1 * | 6/2002 | Sweet et al. | 430/146 |
| 6,451,413 B1 * | 9/2002 | Aurenty et al. | 101/457 |
| 6,455,132 B1 * | 9/2002 | Aurenty et al. | 101/463.1 |
| 6,471,349 B1 * | 10/2002 | Aurenty et al. | 347/100 |
| 6,534,234 B1 * | 3/2003 | Naruse et al. | 101/453 |
| 6,558,458 B1 * | 5/2003 | Gloster | 106/31.27 |
| 2002/0126189 A1 * | 9/2002 | Gloster | 347/100 |

FOREIGN PATENT DOCUMENTS

| | | | | |
|---|---|---|---|---|
| JP | 10024549 A | 1/1998 | | B41C/1/10 |
| JP | 10067087 A | 3/1998 | | B41C/1/10 |
| JP | 10076624 A | 3/1998 | | B41C/1/10 |
| JP | 10076625 A | 3/1998 | | B41C/1/10 |
| JP | 10157053 A | 6/1998 | | B41C/1/06 |
| JP | 10202822 A | 8/1998 | | B41C/1/10 |
| JP | 10203039 A | 8/1998 | | B41N/1/14 |
| JP | 10204354 A | 8/1998 | | C09D/11/00 |
| JP | 10204356 A | 8/1998 | | C09D/11/00 |
| JP | 10219163 A | 8/1998 | | C09D/11/00 |
| JP | 10219164 A | 8/1998 | | C09D/11/00 |
| JP | 10251580 A | 9/1998 | | C09D/11/00 |
| JP | 10259336 A | 9/1998 | | C09D/11/00 |
| JP | 10259338 A | 9/1998 | | C09D/11/00 |
| JP | 10265726 A | 10/1998 | | C09D/11/00 |
| JP | 10272753 A | 10/1998 | | B41C/1/10 |
| JP | 10273611 A | 10/1998 | | C09D/11/00 |
| JP | 10273612 A | 10/1998 | | C09D/11/00 |
| JP | 10273614 A | 10/1998 | | C09D/11/00 |
| JP | 10279867 A | 10/1998 | | C09D/11/00 |
| JP | 10296945 A | 11/1998 | | B41C/1/10 |
| JP | 10298472 A | 11/1998 | | C09D/11/00 |
| JP | 10298473 A | 11/1998 | | C09D/11/00 |
| JP | 10298479 A | 11/1998 | | C09D/11/02 |
| JP | 10315617 A | 12/1998 | | B41M/5/00 |
| JP | 10315645 A | 12/1998 | | B41N/1/14 |
| JP | 10316916 A | 12/1998 | | C09D/11/00 |
| JP | 10316917 A | 12/1998 | | C09D/11/00 |
| JP | 10316920 A | 12/1998 | | C09D/11/10 |
| JP | 10324833 A | 12/1998 | | C09D/11/00 |
| JP | 10324834 A | 12/1998 | | C09D/11/00 |
| JP | 2000-225677 | * 8/2000 | | |

* cited by examiner

CHEMICAL IMAGING OF A LITHOGRAPHIC PRINTING PLATE

CROSS REFERENCE TO RELATED APPLICATIONS

This application is a continuation-in-part of U.S. application Ser. Nos. 09/941,304 and 09/941,323, now U.S. Pat. No. 6,523,471, both filed Aug. 29, 2001, which are, in turn, divisionals of U.S. application Ser. No. 09/566,455, filed May 8, 2000 now U.S. Pat. No. 6,315,916. This application also claim's benefit of U.S. Provisional Application Serial Nos. 60/281,742, 60/281,743 and 60/281,744, all filed on Apr. 3, 2001.

BACKGROUND OF THE INVENTION

This invention relates to a process for imaging a lithographic printing plate and more particularly to a process using an ink jet printer to imagewise apply an insolubilizing chemical to a plate coating which comprises photosensitive compounds or their reaction products.

In the art of lithographic printing it is generally required that one or more lithographic printing plates be mounted on a printing press. The lithographic printing plate is characterized by having on its printing surface oleophilic ink receiving areas in the form of the image to be printed, and hydrophilic water receiving areas corresponding to the other, non-printing areas of the surface. Because of the immiscibility of oil-based lithographic inks and water, on a well-prepared printing plate, ink will fully coat the oleophilic areas of the plate printing surface and not contaminate the hydrophilic areas. The operating press brings the inked plate surface into intimate contact with an impression cylinder or elastic transfer blanket that transfers the ink image to the media to be printed.

Traditionally, a lithographic plate is photographically imaged. The plate substrate is most commonly aluminum, from 5 to 12 mils thick, treated so that the printing surface is hydrophilic, although treated or untreated plastic or paper substrates can also be used. The substrate is coated with a solution of a photosensitive composition that is generally oleophilic. Upon drying, the coating layer thickness is commonly about 1 to 3 microns thick. A printing plate with such a photosensitive coating is called "presensitized" (PS). Both negative and positive working photosensitive compositions are used in PS lithographic plates. In a negative plate, light exposure insolubilizes the coating, so that on development the only parts of the coating that aren't removed are the light imaged areas. The reverse is the case in a positive plate. Light exposure solubilizes the coating; on development the coating is only removed in the areas that are light imaged. In an image reversal process, a positive plate is "blanket exposed" or "flood exposed", i.e., the entire plate is light exposed without any intervening mask or other means for imaging, and imaged in a separate step which can be performed before or after the blanket exposure step. By this image reversal process, a positive plate can be negatively imaged. The aluminum substrate can be treated to make it hydrophilic either prior to the application of the photosensitive composition or at the time the non-image areas of the coating are removed in a development step. Such a process in which a pre-coated lithographic plate is prepared for press by removing exclusively either the imaged or non-imaged coating in a development step is called a subtractive process; a pre-coated plate having a coating which is at least partially removed in a development step is known as a subtractive plate.

Photosensitive compositions used in positive lithographic plates are well known. They, are comprised primarily of alkali soluble resins and o-quione diazide sulfonic acid esters or amides. In addition dyes or colored pigments, indicator dyes, plasticizers and surfactants can also be present. The ingredients are typically dissolved in organic solvents and are coated onto the substrate. Upon drying a thin film or coating is produced.

Alkali soluble resins useful in positive plates are well known and include phenol-formaldehyde resins, cresol-formaldehyde resins, styrene-maleic anhydride copolymers, alkyl vinyl ether-maleic anhydride copolymers, co-or terpolymers that contain either acrylic or methacrylic acids and poly(vinyl phenol). U.S. Pat. No. 4,642,282 describes an alkali soluble polycondensation product that is also useful as the resin component in positive plates.

The o-quinone diazide compounds include o-benzoquinone diazides, o-naphthoquinone diazides and o-anthraquinone diazides. O-quinone diazide compounds useful in positive plates are well known and are described in detail in *Light Sensitive Systems* by J. Kosar, p.339–352. They are further described in U.S. Pat. Nos. 3,046,118; 3,046,119; 3,046,120; 3,046,121; 3,046,122; 3,046,123; 3,148,983; 3,181,461; 3,211,553; 3,635,709; 3,711,285 and 4,639,406 incorporated in entirety herein by reference.

Such positive plates are sensitive to light in the wavelength range of from about 290 to 500 nm. When used in the standard manner, photo-exposure causes the alkali insoluble o-quinone diazide of the positive plate to be converted into an alkali soluble carboxylic acid. Upon subsequent treatment with a developer, which is a dilute aqueous alkaline solution, the exposed parts of the coating are removed. The unexposed coating is alkali insoluble, because the o-quinone diazide is unaffected by the developer, and remains on the substrate.

Traditionally, lithographic plates are imaged by photographic transfer from original artwork. This process is labor-intensive and costly. Hence with the advent of the computer engendering a revolution in the graphics design process preparatory to printing, there have been extensive efforts to pattern printing plates, in particular lithographic printing plates, directly using a computer-controlled apparatus called a platesetter that is supplied with digital data corresponding to the image to be printed. A platesetter has the capability to supply an image forming agent, typically light energy or one or more chemicals, to a plate according to various patterns or images as defined by digital data, i.e., to imagewise apply an image forming agent. Specially manufactured lithographic plates may be required for certain types of platesetters. Such a combination of a computer-controlled platesetter and the proprietary plates used with them along with developer solutions and any other materials or apparatuses necessary to prepare the plates for printing is known as a computer-to-plate (CTP) system.

Heretofore, many of the new CTP systems have been large, complex, and expensive. They are designed for use by large printing companies as a means to streamline the prepress process of their printing operations and to take advantage of the rapid exchange and response to the digital information of graphic designs provided by their customers. Many of the new CTP systems use light sources, typically lasers, to directly image PS plates. But using lasers to image plates is very expensive, because the per-unit cost of the lasers is high and because they require sophisticated focusing optics and electronic controls. If because of the cost only a single laser is used, then time becomes a constraint because of the necessity of raster scanning. There remains a strong need for an economical and efficient CTP system for the many smaller printers who utilize lithographic printing.

In recent years, ink jet printers have replaced laser printers as the most popular hard copy output printers for computers. Ink jet printers have several competitive advantages over laser printers. One advantage is that it is possible to manufacture an array of 10's or even 100's of ink jet nozzles spaced very closely together in a single inexpensive print head. This nozzle array manufacturing capability enables fast printing ink jet devices to be manufactured at a much lower cost than laser printers requiring arrays of lasers. And the precision with which such a nozzle array can be manufactured and the jetting reliability of the incorporated nozzles means that these arrays can be used to print high quality images comparable to photo or laser imaging techniques. Ink jet printers also are increasingly being used for prepress proofing and other graphic arts applications requiring very high quality hard copy output.

In spite of the large and rapidly growing installed base of ink jet printers for hard copy output, ink jet printing technology is not commonly used in CTP systems. There are many challenging technical requirements facing the practitioner who would design such an ink jet based CTP system as can be seen in the prior art. A first requirement is that the ink jet ink used to image the printing plate be jettable, able to form ink drops of repeatable volume and in an unvarying direction. Further, for practical commercial application, the ink must have a long shelf life, in excess of one year or more. U.S. Pat. No. 5,970,873 (DeBoer et al) describes the jetting of a mixture of a sol precursor in a liquid to a suitably prepared printing substrate. But any ink constituents of limited solubility will render unlikely the practical formulation of a jettable, shelf-stable ink. Similar problems exist in U.S. Pat. No. 5,820,932 (Hallman et al) in which complex organic resins are jetted, and U.S. Pat. No. 5,738,013 (Kellet) in which marginally stable transition metal complexes are jetted. In U.S. Pat. No. 6,187,380 B1 (Hallman et al) and U.S. Pat. No. 6,131,514 (Simons), inks comprising acrylic resins such as trimethylolpropanetriacrylate and poly (ethylene-co-acrylic acid, sodium salt), are jetted. While it may be possible to make such a ink formulation work for the purposes of a short term experiment, it would almost certainly clog the nozzles of an ink jet printhead were the ink allowed to remain in the printer for the weeks or more that would be a requirement of practical commercial use.

Another requirement is that to be of wide utility, the ink jet based CTP system should be able to prepare printing plates with small printing dots, approximately 75 microns in diameter or smaller, so that high resolution images can be printed. Ink jet printers can produce such small dots, but of those having substantial commercial acceptance, only ink jet printers employing aqueous-based inks are practically capable of printing such small dots. Thus the systems described in U.S. Pat. No. 4,003,312 (Gunther), U.S. Pat. No. 5,495,803 (Gerber), U.S. Pat. No. 6,104,931 (Fromson et al), and U.S. Pat. No. 6,019,045 (Kato) which use solvent-based hot melt inks will not allow the preparation of the high resolution printing plates necessary for printed images of high quality. Further, hot melt type inks typically freeze on top of the imaged media rather than penetrate into it. This would prevent intimate mixing between potential reactants in the inks and corresponding potential reactants in a PS plate coating. It is also required that the prepared printing plates be rugged, capable of sustaining press runs of many thousands of impressions. The waxes used in the hot melt inks described in U.S. Pat. No. 6,019,045 (Kato) and U.S. Pat. No. 4,833,486 (Zerillo) would wear out in such a long press run.

Another requirement of a successful inkjet based CTP system is that a mature plate technology is to be preferred. Although the prior art demonstrates that it is not obvious to do so, it greatly simplifies the development of an ink jet CTP system to be able to use commercially available, widely accepted PS plates. There are many tradeoffs in the manufacture of commercially practical lithographic plates. They must be highly sensitive to the imaging process and yet thermally stable, stable in high humidity storage environments and yellow light, resistant to fingerprints, of minimal toxicity and environmentally benign, easily developed in that small dots are quantitatively resolved without dot blooming using developers that are of minimal toxicity and environmentally benign, able to sustain long press runs, manufacturable at a low cost per square foot, and many other practical requirements. U.S. Pat. No. 5,695,908 (Furukawa) describes a process for preparing a printing plate comprising a new plate coating containing a water-soluble polymer that becomes water-insoluble in contact with a metal ion in a solution jetted imagewise. But such a new plate coating is unlikely to meet the wide array of constraints on a successful plate technology. U.S. Pat. No. 5,466,653 (Ma et al) describes a plate coating that requires an impractically high reaction temperature for imaging. U.S. Pat. No. 6,025,022 (Matzinger) describes a new plate coating on a glass substrate that would be unlikely to find wide acceptance.

To use an ink jet printer in a positive imaging process is impractical because in typical printing, the area of a plate containing images such as text, graphics, and line work, is much less that the non-image containing area of the plate. Thus to be able to image widely accepted positive plates with a negative imaging ink jet process is a unique, surprising, and valuable result.

Positive plates based on o-naphthoquinone diazide sulfonic acid esters can be modified by the incorporation of alkaline materials to obtain image reversal. U.S. Pat. No. 4,104,070 describes the use of imidazolines; U.S. Pat. No. 4,196,003 describes the addition of secondary and tertiary amines and U.S. Pat. No. 4,356,254 describes the addition of basic carbonium dyes to produce image reversal. The sequential steps for this image reversal process are imagewise light exposure, heat treatment, blanket light exposure and alkaline development. Those coatings have never achieved any commercial success, which is attributed to the adverse effect on the properties of the coating by the addition of the alkaline materials. U.S. Pat. No. 4,007,047 describes image reversal of a positive resist by a modification of the photoimaging process. After imagewise exposure, the resist coating is subjected to an acid treatment by immersion into a heated acid solution, which after a water rinse and drying steps produces a negative image after blanket light exposure and development.

SUMMARY OF THE INVENTION

The present invention provides a process for preparing PS lithographic plates for printing by employing an ink jet printhead to imagewise apply an insolubilizing chemical. In one aspect of the invention, the steps comprise:

(a) providing an on-press developable PS plate;

(b) imagewise applying an insolubilizing chemical to the plate coating;

(c) heating the plate;

(d) mounting the plate on a printing press; and (e) operating the press.

In another aspect of the invention, the steps comprise:
(a) providing a positive plate;
(b) blanket exposing the plate;
(c) imagewise applying an insolubilizing chemical to the plate coating;
(d) heating the plate; and
(e) developing the plate.

In yet another aspect of the invention, the steps comprise:
(a) providing a plate with a coating;
(b) imagewise applying an insolubilizing chemical to the coating;
(c) heating the plate; and
(d) washing the plate with a developing solution.

Accordingly, there are several objects and advantages of the present invention. An object of the present invention is that it is easily embodied in a practical, reliable, and inexpensive ink-jet-based CTP system with minimal constraints on the formulation of the imaging fluid, and in that widely-available, commercially-accepted lithographic plates with desirable aluminum substrates and their corresponding commercially-accepted development solutions can be used without modification. A plate prepared by the present invention is functionally similar to a plate prepared by photographic imaging, with a potential long run life but without the complexity, cost, or waste of a film negative. The plate can be prepared quickly, in that fewer steps are required and in that a speedy ink jet printer can be employed, and yet the plate image is of high resolution, enabling high quality 4-color printing. Further, the plate thus prepared is storage stable, little subject to contamination in its hydrophilic areas and can be used on a wide variety of commercially available and accepted printing presses. The formulation of the insolubilizing fluid is flexible and can be simple, inexpensive to manufacture, environmentally safe, and non-toxic. Water can be used as a vehicle resulting in small drops that easily penetrate PS coatings facilitating intimate mixing of the insolubilizing chemical with the reactive constituents of the coating. The chemicals used in the fluid in this invention that enable insolubilization to occur on negative and photo-exposed positive plates cover a wide range of materials. That such a simply and flexibly formulated ink can be jetted in very small diameter drops to produce high resolution images on conventional and widely accepted positive and negative working plates is a unique and surprising result. That commercially available positive plates can be economically and efficiently imaged by ink jet in a negative working process is a unique and surprising result. Printers already using positive plates for printing requiring light imaging exposure can now use efficient and economical ink jet negative imaging without having to switch plate types.

Still other objects and advantages will become apparent from the claims, and from a consideration of the ensuing detailed description of the invention.

DETAILED DESCRIPTION OF THE INVENTION

Figure 1:
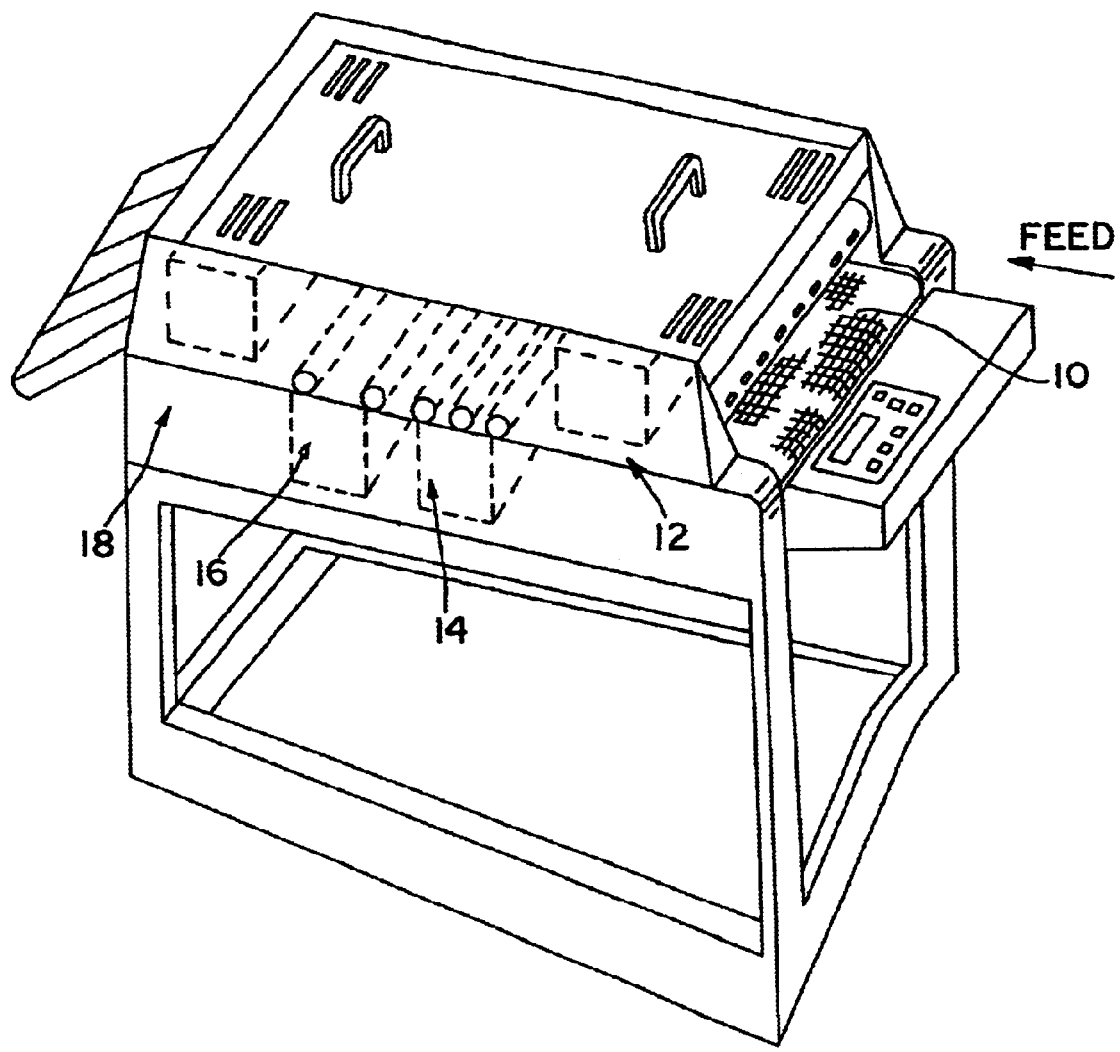
FIG. 1 is a cross-sectional perspective view of a conventional developing processor in a preferred configuration according to the prior art.

The invention comprises a subtractive process for preparing a printing plate for press by imagewise applying an insolubilizing chemical to a coated plate, completing the insolubilization reaction by heating if necessary, and washing the plate with a developing solution. The insolubilizing chemical undergoes a chemical reaction with, or facilitates a chemical reaction in, the plate coating, making the reacted coating insoluble to a developing solution in which the unreacted coating is soluble. In the case of an on-press developable plate, the developing step is effectively performed using the working fluids of the press, i.e., the press fountain solution and ink.

A computer-to-plate system according to the invention preferably comprises an ink jet printer (IJP) and a developing processor. To facilitate accurate imaging of the plate, the paper-handling or substrate-handling subsystem of ink jet printer should have a short, straight paper path. A printing plate is generally stiffer and heavier than the paper or media typically used in commercially available inkjet printers. If the plate fed into the printer mechanism must bend before or after being presented to the imaging print head, then the movement of the plate through the printer may not be as accurate as the media for which the printer was designed. The most preferred EPSON STYLUS COLOR 3000 has such a short, straight paper path. A platen is preferably placed at the entrance to the paper feed mechanism. The platen preferably has a registration guide rail and supports the plate as it is pulled into the printer by the feed mechanism, facilitating the accurate transport of the plate under the imaging print head.

In the most preferred embodiment, the IJP used is a commercially available drop-on-demand printer capable of printing small ink drops having volumes no larger than 8 picoliters (8 pl) such as the EPSON STYLUS COLOR 3000 ink jet printer available from Epson America, Inc., Long Beach, Cailf. However, the great flexibility available to the practitioner in formulating an insolubilizing fluid according to the invention means that a well-performing jettable solution can be formulated such that the print head of almost any ink jet printer will be able to form regular drops with good reliability.

Because the powerful solvating capability of water, aqueous ink jet drops typically penetrate the imaged media. Without being bound by theory, it is believed this may be important to the invention because it is probably necessary for the insolubilizing chemical to be brought into intimate contact with the reactive constituents of the plate coating to effect insolubilization. Although water is the most-preferred fluid vehicle, it is also possible to use other penetrating solvents such as methyl ethyl ketone, ethyl acetate, ethyl lactate, dimethyl formamide, acetone, simple alcohols, and other like chemicals or mixtures of such chemicals. Typically, the vehicle would comprise 30 to 99 percent of the imaging fluid.

In one embodiment of the invention, the insolubilizing agent comprises pH-elevating agents typically of low molecular weight such as sodium carbonate, sodium bicarbonate, lithium carbonate, lithium hydroxide, sodium hydroxide, potassium hydroxide, sodium tetraboratedecahydrate, sodium pyrophosphatedecahydrate, sodium phosphate, sodium metasilicate, or amines such as ethanolamine, diethanolamine, triethanolamine, ethylamine, propylamine, butylamine, imidazolines, substituted imidazolines such as 1-hydroxyethyl-2-cocylimidazoline, 1-hydroxyethyl-2-caprylimidazoline, 1-hydroxyethyl-2-oleylimidazoline, and 1-hydroxyethyl-2-tall oil imidazoline, tall-oil fatty acid-diethylenetriamine imidazoline, imidazoles, substituted imidazoles, amino amides, polyamines, or mixtures of such chemicals. The pH range of the imaging fluid is between 7.5 and 14, and more preferably from about 8.0 to 12.5.

In another embodiment of the invention, the insolubilizing agent comprises one or more amine salts prepared by the reactions of amines including imidazolines with either acids or with quaternarizing agents. Examples of such amine salts are ammonium acetate, acetates of ethyl amine, propyl amine and triethanol amine and related salts, 1-hydroxyethyl-2-cocylimidonium sulfate, 1-hydroxyethyl-2-cocylimidonium acetate, imidonium acetate, 1-hydroxyethyl-2-caprylimidonium hydroxyacetate, 1-hydroxyethyl-2-oleylimidonium phosphate, isostearyl ethylimidonium ethosulfate, acetates of amino amides and related compounds. The insolubilizing agent typically comprises from 0.05 to 7 percent of the fluid, but in specific instances can comprise as much as 25% of the fluid.

For reliable jetting, and so that during idle periods the fluid does not dry out in the ink jet nozzle causing it to clog, a humidifying co-solvent may be added to the insolubilizing fluid. The co-solvent can be a polyhydric alcohol such as glycerin, ethoxylated glycerin, ethylene glycol, diethylene glycol, triethylene glycol, propylene glycol, dipropylene glycol, or trimethylol propane, other high boiling point liquids such as pyrrolidone, methylpyrrolidone, or triethanol amine, other simple alcohols such as isopropyl alcohol or tertiary butyl alcohol, or mixtures of such solvents. When used, the co-solvent would typically comprise 5 to 70 percent of the fluid.

A dye compatible with the insolubilizing agent can be added to the fluid at a level of a few percent to enhance the visibility of the latent image. The insolubilizing fluid may contain one or more surfactants or wetting agents to control the surface tension of the ink, enhancing jettability, and to control the spread and penetration of the drop on the coated plate. The surfactants and wetting agents may include acetylenic glycols, such as SURFYNOL 104, SURFYNOL 465, SURFYNOL FS-80, SURFYNOL PSA-216, DYNOL 604, polyethoxylated octyl phenols, such as TRITON X-100, and similar chemicals or mixtures of similar chemicals. When used, surfactants and wetting agents typically comprise 0.001 to 10 percent of the fluid.

The insolubilizing fluid may also contain one or more biocides to prolong the shelf life of the fluid. Suitable biocides include for example PROXEL GXL, solution of 1,2-benzothiazoline-3-one, sodium hydroxide and dipropylene glycol, sodium OMADINE, 2-pyridinethiol-1-oxide, sodium salt, DOWICIL, cis-1-(3-chloroallyl)-3,5,7-triaza-1-azoniaadamantane chloride, GIVGUARD DXN, and similar chemicals or mixtures of such chemicals. When used, the biocide would typically comprise 0.1 to 3 percent of the ink. If the pH of the insolubilizing fluid is over 10, it is not necessary to use a biocide and this is preferred.

A typical formulation for an insolubilizing fluid comprises:

| | |
|---|---|
| Water with sufficient amount of insolubilizing agent | 70% |
| Co-solvent | 26% |
| Dye | 3% |
| Surfactant | 1% |

Imagewise application of the insolubilizing fluid onto the plate coating using an ink jet printhead results in a latent image on the plate. To complete preparation for use, it is then necessary to develop the imaged plate. In one embodiment of the invention, it is preferable to use a conventional developing processor. A most preferred processor configuration is illustrated in FIG. 1. An imaged plate is conveyed first through a hot air drying section 10, second through a pre-heat oven 12, third through a development station 4 where the appropriate developing solution is poured on the plate and the solubilized coating removed. Fourth, the plate is conveyed through a rinse section 16, and finally, fifth through a post bake oven 18. The plate is then ready to be used on press.

Figure 2:
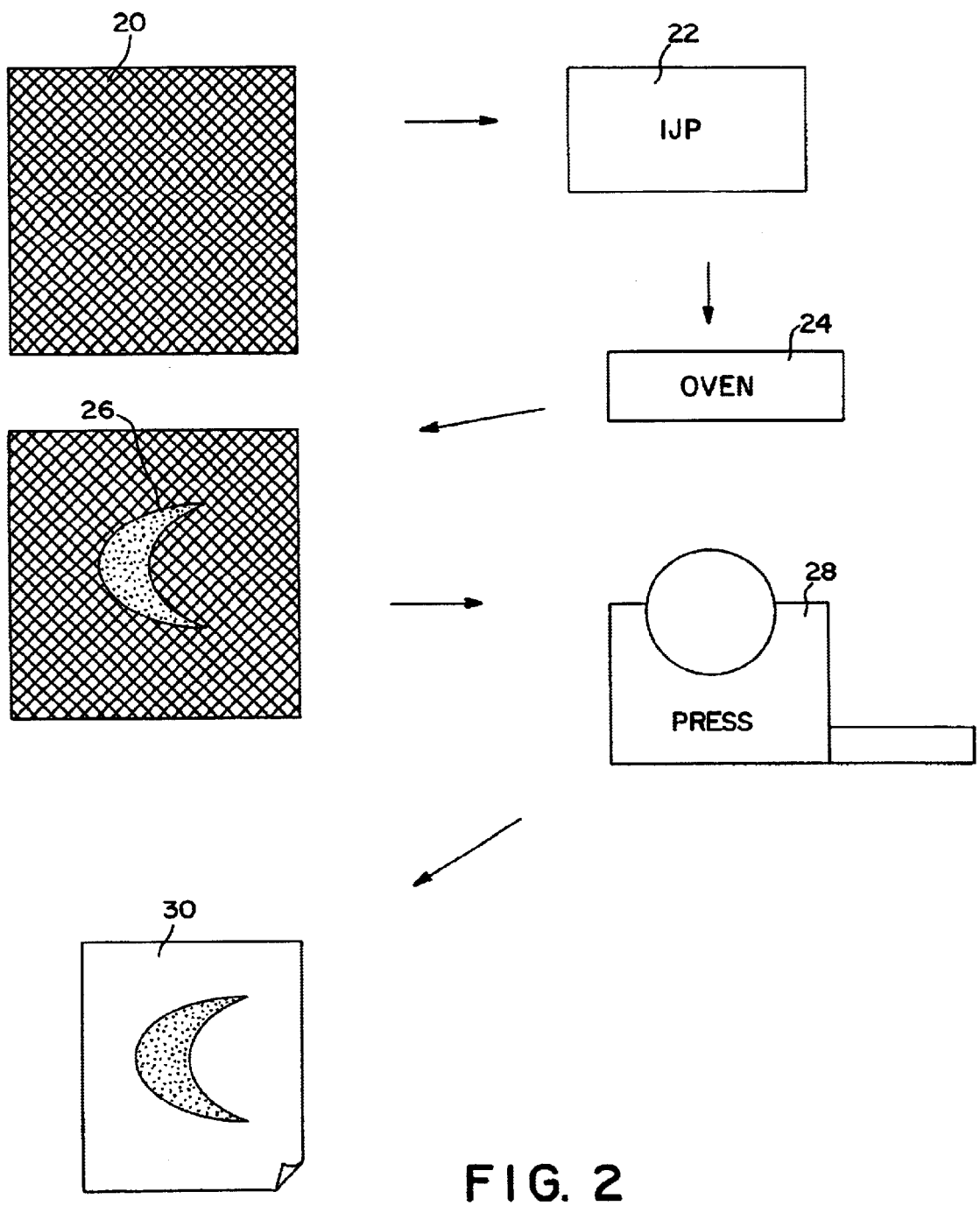
FIG. 2 is a block diagram flowchart depicting the process in which an on-press developable printing plate is imaged by ink jet, developed on press, and then used in a printing operation.

In another embodiment of the invention, illustrated in FIG. 2, an on-press developable plate is imaged. In this embodiment, after imaging of the subtractive plate 20 by an ink jet printer 22, no conventional development of the latent image 26 is required. Instead, the plate is first heated in an oven 24 to dry the image and, without being bound by theory, complete the insolubilization reaction. Second, the plate is mounted on the plate cylinder of a conventional offset lithographic press 28. Third, the latent image is developed by operating the press such that the plate cylinder is rotated and the working fluids of the press, i.e., the press ink and fountain solution, are applied to the plate coating. The plate is then ready to be used to print images on paper or other media 30 by the normal operation of the press.

Positive Plate

Figure 3:
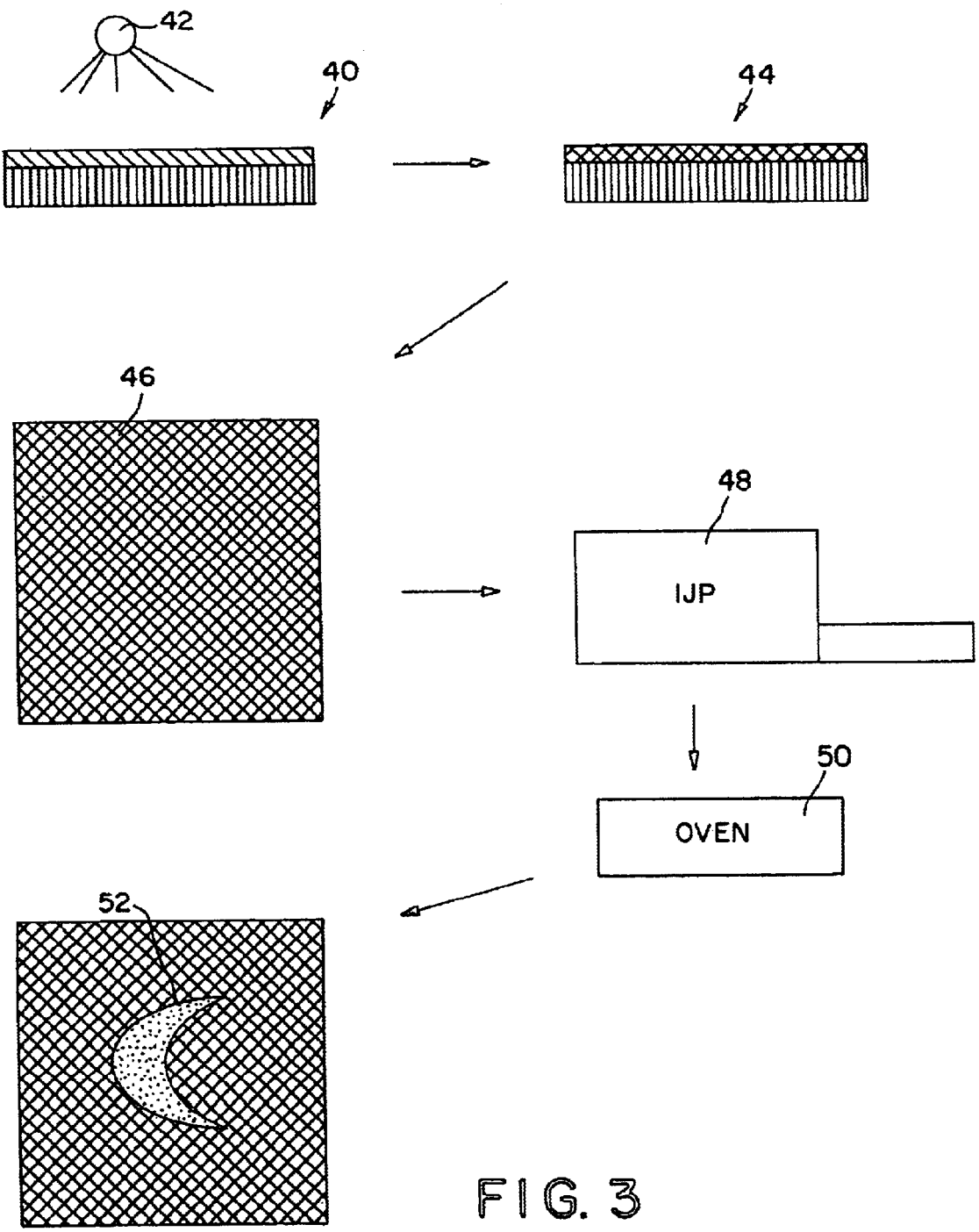
FIG. 3 is a block diagram flowchart depicting a process in which an image reversal technique is used to negatively image a presensitized printing plate by ink jet.
Figure 4:
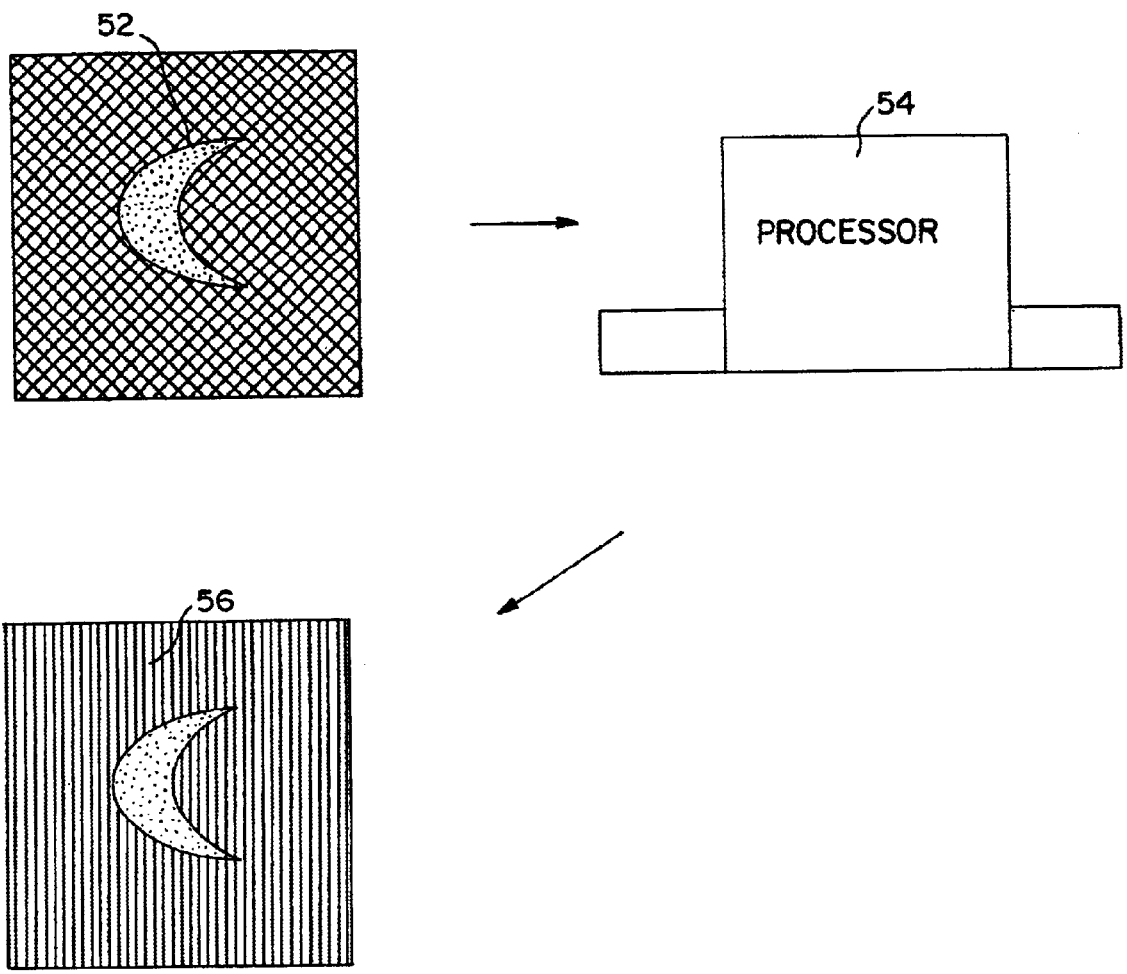
FIG. 4 is a continuation of the flowchart of FIG. 3.

In this aspect of the invention, as illustrated in FIGS. 3 and 4, a method for preparing a positive plate for press by an image reversal process comprises the steps of:

a) providing a conventional subtractive positive plate. A side view is shown 40.

b) Blanket exposing the plate coating using a light source 42. A side view of the exposed plate is shown 44. A top view of the exposed plate is shown 46.

c) Applying imagewise an insolubilizing chemical to the coating preferably using an ink jet printer 48;

d) heating the plate in an oven 50. The latent image on the plate is indicated 52.

e) Developing the plate in a conventional processor 54. The plate is then ready for use 56.

The positive plate can be blanket light exposed just before the plate is chemically imaged. The IJP can also be expanded to include a light exposure attachment placed on the printer before the imaging printhead. In this expanded system, the blanket light exposure and chemical imaging steps can be performed in a continuous operation. The plate can also be blanket light exposed at the time of manufacture by including a light exposure step after drying and before packaging. The latter procedure would eliminate a processing step for the user. Preferred light sources that can be used in the blanket light exposure step are those that emit light in the wavelength range of from about 290 to 500 nm. Suitable light sources are carbon arcs, mercury lamps, fluorescent lamps and metal halide lamps.

After blanket exposure, a latent image is created in the coating of the plate by imagewise application of a chemical that causes the affected area of the coating to become insoluble in the developing solution. It is simplest and preferred to formulate a fluid solution comprising the insolubilizing chemical, and to use an ink jet printer for the imagewise application of the insolubilizing solution. As described above, effective insolubilizing agents can be bases including amines, and amine salts.

According to this invention, without being bound by theory, when the positive plate is first given a blanket light exposure the o-quinone diazide compound is converted into a carboxylic acid that renders the coating soluble in dilute aqueous alkaline solutions. An insolubilizing fluid is then imagewise jetted onto the light exposed plate followed by a brief heat treatment of the plate. During the heat treatment step, decarboxylation is believed to occur only in the areas on the plate that were jetted with fluid. In these decarboxylated areas, the coating is no longer soluble in dilute aqueous alkaline solutions such as typical positive plate developing solutions. When treated with such dilute alkaline solutions in the development step, all the coating is removed from the plate except in the areas where the fluid has been jetted. A reverse image is thus produced. The plate is then ready to be mounted and used in a conventional press.

Note that this process, termed an "image reversal" process as used herein is somewhat different than the typical light-based image reversal processes used in photolithographic applications in that it is usually necessary to follow the imagewise application of the chemical by a heating step. Further, the imaging step is carried out after the blanket exposure step rather than before because the carboxylic acids in the coating need to be created via the blanket exposure step before they can be decarboxylated in the imaging and heating steps. In a prior art application of image reversal for the purpose of imaging printing plates described in U.S. Pat. No. 4,927,741, the blanket exposure step follows the heat treatment, which reduces the effectiveness of the blanket exposure step in solubilizing the non imaged areas of the coating. In this patent, a cumbersome method to minimize this problem is described which requires that the blanket exposure step be carried out while the coating is submerged under water.

The concentration of the active ingredient, the decarboxylating agent, in the insolubilizing fluid can range from about 0.05 to 20 percent or preferably from about 0.1 to 3.5 percent. A dye compatible with either the alkaline materials or the amine salts can be added to the fluid at a level of a few percent to enhance the visibility of the latent image.

After application of the insolubilizing chemical, the plate is heated for the purpose of completing the insolubilization reaction. The plate may be heated to a temperature in the range of 149° C. to 177° C. or 218° C. The extent of the heat treatment required is dependent on the particular o-quinone diazide that is incorporated in the coating. A coating made from an o-quinone diazide having the sulfonic acid ester group in the same ring as the quinone diazide group requires a less vigorous heat treatment than one where the two groups aren't in the same ring. If the plate coating is made from an o-naphthoquinone 1-,2-(diazide-2)-5-sulfonic acid ester, it is preferably heated to between 55 to 30° C. for from 5 seconds to 10 minutes or most preferably from about 90 to 110° C. for 1 to 2 minutes. If the plate coating is made from an o-naphthoquinone-1,2-(diazide-2)-4-sulfonic acid ester, it is preferably heated to between 40 to 110° C. for from 3 seconds to 5 minutes or most preferably from about 50 to 60° C. for from 30 to 90 seconds. The maximum heat treatment that can be applied is limited by the heat treatment conditions of time and temperature that would cause decarboxylation to occur in the non-chemically imaged areas of the coating. After heating, the plate is developed either by hand or preferably with a conventional developing processor using a conventional developing solution to produce the image.

As described above, the insolubilizing fluid applied to the light exposed positive plate is believed to react by decarboxylating the carboxylic acid that forms from the o-quinone diazide during photo-exposure. The elimination of the carboxylic group in one of the chemicals in the lithographic plate coating changes its alkaline solubility from soluble to insoluble. When the plate is processed by the developing solution, a dilute aqueous alkaline solution, the unprinted areas of the coating are quantitatively dissolved, leaving the hydrophilic-treated aluminum bare, and the printed areas coating are apparently undisturbed.

The concentration of the o-quinone diazide in the positive plate can vary over wide limits. In general, the proportion is 5 to 50 percent and more preferably between 20 and 40 percent, based upon weight. The concentration of the resin component is from about 50 to 95 percent and more preferably from 60 to 80 percent. The resin component can be used without any addition of a separate o-quinone diazide compound if the resin has o-quinone diazide groups covalently bonded to it. The coating thickness of the positive coating can range from about 0.4 to 4 grams/square meter. The preferred o-quinone diazides are naphthoquinone-1,2-(diazide-2)-5-sulfonic acid esters and naphthoquinone-1,2-(diazide-2)-4-sulfonic acid esters. They are prepared by the reactions of the corresponding sulfonyl chlorides with alcohols and phenols. The preferred phenolic compounds for these reactions are cresol-formaldehyde resins, di, tri, tetra, and poly hydroxy aromatics either unsubstituted or substituted with other groups. Some examples of such phenolic compounds are resorcinol, phloroglucinol, 2,3,4-trihydroxybenzophenone and tetrahydroxybenzophenone.

The developer used for this invention is similar to the typical dilute aqueous alkaline solutions used on positive plates. They preferably have a pH of 11 or higher. Illustrative of the various bases that can be used to adjust the alkalinity of the developer are sodium hydroxide, potassium hydroxide, sodium silicate, potassium silicate, sodium metasilicate, potassium metasilicate, sodium phosphate, sodium dihydrogen phosphate, ethanolamine or mixtures of such chemicals. Surfactants are also added to the developer and include such anionic surfactants as sodium alkylbenzenesulfonates, sodium alkylnaphthalenesulfonates and sodium dialkylsulfosuccinates at concentrations from about 0.003 to 3 percent by weight.

In this invention, the use of positive plates together with their respective developers is highly desirable and advantageous. Positive plates have outstanding stability; some such plates have a shelf-life of more than two years when stored at room temperature. They also have excellent resolution and produce images that have a long press-life that is greatly extended by a bake process when heated at about 250 to 280° C. for about 1 to 3 minutes. The image reversal process doesn't detract from these properties. The developers used on the positive plates are ecologically acceptable; they don't contain any undesirable volatile organic chemicals.

The following non-limiting examples serve to illustrate the invention.

EXAMPLE 1

Prepare a solution of 29.6 grams ALNOVOL PN-430, a cresol formaldehyde novolac resin available from Hoechst in 308 grams ethyl lactate. To 50 grams of this solution, add 2.7 grams of POSITIVE DIAZO LL, a naphthoquinone-1, 2-(diazide-2)-5-sulfonic acid ester available from Molecular Rearrangement Inc. of Newton, N.J (MRI) which is made by the reaction of naphthoquinone-1,2-(diazide-2)-5-sulfonyl chloride with 2,2'-thiobisnaphthol. In this reaction, mono and sulfonic acid esters can form. The molar ratio of the two reactants in the manufacture of POSITIVE DIAZO LL is adjusted so that the product that is produced is a mixture of 60% disulfonic acid ester and 40% monosulfonic acid ester. The solution is coated onto a grained, anodized and silicated aluminum sheet using a number 10 wire wound rod followed by drying with a hot air dryer. The entire plate is blanket exposed to 20 units of light using the high intensity setting of a MAGNUM PLATEMAKER. Microdrops of 1% aqueous solutions of sodium metasilicatepentahydrate and sodium carbonate together with a 1% solution of triethanolamine in a solvent mixture of 25 parts acetone and 75 parts water are then applied. The treated coating is then heated for 10 minutes at 110° C. followed by development with an alkaline solution of the following composition:

| | |
|---|---|
| Sodium metasilicatepentahydrate (from the PQ Corp. under the name PENTABEAD 20) | 55 grams |
| AEROSOL OS Surfactant from Cytec | 2.2 grams |
| Water | 1000 ml |

The parts of the coating where the drops are applied are insolubilized in the developer by the heat treatment. The other parts of the coating are still soluble in the developer after the heat treatment. During development, they are quantitively removed leaving the hydrophilically treated aluminum bare. Images are produced on the coated plate from the sodium carbonate and sodium metasilicate solutions that correspond to the size of the drops of the applied solutions. Spreading of the triethanolamine solution occurs when it is applied onto the coating. It produces a larger image than the original size of the drops. The spreading of the drop is attributed to the presence of acetone in the solution.

The above-coated plate is a positive plate. When light exposed and developed in the usual manner without any chemical treatment, a positive image is produced.

EXAMPLE 2

In this example, a positive plate, commercially available from LASTRA (FUTORO-ORO) of Sulmona, Italy is evaluated. It is comprised of an o-naphthoquinone diazide-5-sulfonic acid ester and alkali soluble resins together with dyes and indicator dyes. The LASTRA plate is blanket light exposed by the procedure used on the coating from Example 1. Drops of 1% sodium carbonate are applied onto the exposed plate followed by heating at 120° C. for 4 minutes. After development by the alkaline developer solution used in Example 1, an excellent image is produced that corresponds to the size of the applied drops. During the heat treatment, the coating is only insolubilized where the sodium carbonate solution is applied.

EXAMPLE 3

This example describes image formation on the LASTRA positive plate using MONAZOLINE C, 1-hydroxyethyl-2-cocoylimidazoline available from Uniqema in New Castle, Del. Prepare the following solutions:

| | A | B | C | D |
|---|---|---|---|---|
| MONAZOLINE C | 0.25 g | 0.25 g | 0.18 g | 0.09 g |
| Isopropyl Alcohol | 2.5 g | 7.5 g | 5.5 g | 4.5 g |
| Glycerine | — | — | 2.0 g | 4.5 g |
| Water | 8 g | 62.5 g | 22.5 g | 45 g |

A LASTRA positive plate is blanket light exposed by the procedure used on the coating from Example 1. Drops of the solutions A through D are applied onto the coating. Parts of the coating where solution:

1. A is applied are heated at 120° C. for 1 minute,
2. B is applied are heated at 105° C. for 45 seconds and also at 95° C. for 1 minute,
3. C is applied are heated at 95° C. for 1 minute and
4. D is applied are heated at 95° C. for 30 seconds and also at 70° C. for 1 minute.

After development by the alkaline developer described in Example 1, excellent images are produced by the four solutions on all the plates that are differently heat treated. When the imaged plates are treated with water and then rubbed with a WEBRIL wipe that is saturated with water and a lithographic ink, the images are inked while the aluminum in the non-imaged areas don't absorb any ink. This example illustrates that image formation takes place from solutions of MONAZOLINE C over a wide concentration range and that the time and temperature of the heating step are also over a wide range.

EXAMPLE 4

This example illustrates image formation using MONAZOLINE C ACETATE, which is prepared by the addition of acetic acid to an aqueous dispersion of MONAZOLINE C. Prepare the following solutions:

| | A | B | C |
|---|---|---|---|
| MONAZOLINE C | 0.3 | 0.3 g | 0.3 g |
| Water | 60 ml | 60 ml | 60 ml |
| Acetic Acid, 3.4% | 1.0 g | 1.7 g | 2.1 g |

The pH of Solutions A, B and C is 10, 7 and 5, respectively. The pH of the MONAZOLINE C solution without the addition of acetic acid is 11. MONAZOLINE C ACETATE is water soluble and upon the addition of acetic acid, MONAZOLINE C is solubilized. The LASTRA positive plate is blanket light exposed by the procedure described in Example 1. Drops of the three solutions are applied onto the plate and then heated at 100° C. for 1 minute. After development with the alkaline developer, excellent images are produced where the drops are applied that correspond to the size of the applied drop. The images were unaffected by rubbing vigorously with a WEBRIL wipe that is wet with the alkaline developer and is indicative of its excellent adhesion and chemical resistance. The low pH of Solution C is an indication that in addition to the formation of the acetate salt of the imidazoline, some unreacted acetic acid is present which doesn't detract from its decarboxylating properties.

EXAMPLE 5

This example illustrates image formation on the LASTRA positive plate using triethanolamine. Prepare a solution of:

| | |
|---|---|
| Triethanolamine | 0.3 g |
| Isopropyl Alcohol | 3 g |
| Water | 62 g |

Apply the solution onto the blanket light exposed plate and after heating at 110° C. for 2 minutes followed by development in the usual manner, satisfactory images are produced where the drops are applied.

EXAMPLE 6

This example illustrates image formation using imidazole. Prepare a solution of:

| | |
|---|---|
| Imidazole from BASF | 3 g |
| Ethanol | 10 g |
| Water | 90 g |

Apply the solution onto a blanket light exposed LASTRA plate and then heated at 90° C. for 90 seconds followed by alkaline development. Satisfactory images are produced where the solution is applied. The pH is 8.5 for the 1% imidazole solution.

EXAMPLE 7

This example illustrates image formation with MONAZOLINE O and T and the evaluation of three other commercially available positive plates based on naphthoquinone-1,2-(diazide-2))-5-sulfonic acid esters, CAPRICORN DH from KPG in Norwalk, Conn.; STEINBACHER ELAN SP 123 from Steinbacher Polymer GMBH in Germany and the INKKER positive plate from Inkker Systems Corp. in Seoul, Korea. Prepare solutions:

| | A | B | C |
|---|---|---|---|
| MONAZOLINE T, Tall Oil Hydroxyethyl Imidazoline, from Uniqema | 0.2 g | — | — |
| MONAZOLINE O, Oleyl Hydroxyethyl Imidazoline, from Uniqema | — | 0.2 g | — |
| MONAZOLINE C | — | — | 0.4 g |
| Ethyl Lactate | 4 g | 3 g | — |
| Glycerin | 2 g | 2 g | — |
| Water | 25 g | 25 g | 25 g |
| Acetic Acid, 3.4% | — | — | 1.5 g |

All three plates are blanket light exposed to 20 units of light from the high intensity setting of the MAGNUM PLATEMAKER. Drops of solutions A and B are applied onto the KPG and STEINBACHER plates which are then heated at 105° C. for 1 minute followed by development with the dilute aqueous alkaline solution used in Example 1. On both plates the only areas where the coating was insoluble and remained on the plate was where the drops were applied. Excellent images are produced that correspond to the size of the applied drops. The unexposed coating is completely removed leaving the aluminum hydrophilic in those areas.

Drops of solution C are applied onto the INKKER plate that is then heated at 105° C. followed by development as previously described in this example. Excellent images are produced where the drops are applied and in the other areas the coating is completely removed leaving the aluminum hydrophilic.

EXAMPLE 8

This example illustrates image reversal of positive plates using isostearyl ethylimidonium ethosulfate available from Uniqema Corp. under the name MONOQUAT ISIES and evaluates a positive plate made with the same ingredients as the one described in Example 1 except that it contains two additional ingredients, a dye and an indicator dye. Prepare a solution of:

| | |
|---|---|
| Ethyl Lactate | 44 g |
| Diazo LL | 2.69 g |
| ALNOVOL PN-430 | 4.32 g |
| Victoria Blue Dye | 0.07 g |
| Sudan M Yellow 150 from BASF | 0.07 g | which is coated onto a grained, anodized and silicated sheet of aluminum using a number 10 wire wound rod and dried with a hot air blower. Prepare solutions of:

| | A | B |
|---|---|---|
| MONOQUAT ISIES | 0.40 G | — |
| MONAZOLINE C | — | 0.25 g |
| Isopropyl Alcohol, 70% | 4 g | — |
| Ethyl Lactate | — | 3 g |
| Glycerin | 0.75 g | 2 g |
| Water | 25 g | 25 g |

The pH of Solution A is 6.5. After blanket light exposure of the positive plate, apply drops of solutions A and B and then heat for 1 minute at 105° C. The coating is insolubilized where the drops are applied. After development by the alkaline developer, excellent images are produced and the aluminum in the non-imaged areas is hydrophilic. Drops of solution A are also applied to a blanket light exposed positive plate of Inkker Systems Corp. which after heating at 105° C. for 1 minute followed by development with the alkaline developer produce excellent images. The only areas of the coating that are insoluble in the developer are where the drops are applied.

EXAMPLE 9

This example illustrates image formation using an amino amide and its corresponding acetate that are produced from MONAZOLINE C, coycoyl hydroxyethyl imidazoline. In the presence of water MONAZOLINE C and its acetate salt will gradually hydrolyze to produce an amino amide and an acetate salt, respectively. Prepare solutions of:

| | A | B |
|---|---|---|
| MONAZOLINE C | 0.2 g | 0.25 g |
| Ethyl lactate | — | 3 g |
| Glycerine | — | 0.75 g |
| Water | 40 g | 25 g |
| Acetic Acid, 3.4% | 1.4 g | — |

The two solutions are stored at room temperature for two months and within this period hydrolysis is believed to occur to produce the amino amide and amino amide acetate. Drops of the two solutions are applied onto the blanket light exposed positive plates of the one prepared in Example 8 and of the Inkker Systems Corp. They are then heated at 105° C. for 1 minute followed by development with the alkaline developer. Excellent images are produced where the drops are applied and in the other areas the coating is readily removed.

EXAMPLE 10

This example illustrates image reversal of positive plates using the sulfate and phosphate salts of MONAZOLINE C and using WITCAMINE TI-60, tall-oil fatty acid-diethylenetriamine imidazoline, ethoxylated available from the Crompton Corporation. The LASTRA positive plate is blanket light exposed as previously described. Prepare solutions of:

|  | A | B | C | D | E |
|---|---|---|---|---|---|
| MONAZOLINE C | 0.23 g | 0.23 g | 0.23 g | 0.23 g | — |
| WITCAMINE TI-60 | — | — | — | — | 0.5 g |
| Water | 40 ml | 40 ml | 40 ml | 40 ml | 50 ml |
| Sulfuric Acid, 3.4% | 1 g | 1.4 g | — | — | — |
| Phosphoric Acid, 3.4% | — | — | 1 g | 1.6 g | — |
| pH | 8 | 4 | 8.5 | 4 | 8.3 |

Drops of the five solutions are applied onto the blanket exposed LASTRA plate, which is then heated at 110° C. for 2 minutes followed by development by the dilute aqueous alkaline developer. The coating is only insoluble in the developer where the drops are applied. On development, excellent images are produced. A 3.4% aqueous solution of phosphoric acid containing 10% ethanol when applied onto the blanket light exposed LASTRA plate followed by heating at 110° C. for 3.5 minutes didn't insolubilize the coating in the dilute aqueous developer. This indicates that the phosphoric acid that is present in Solution D is not insolubilizing the LASTRA plate.

EXAMPLE 11

This example illustrates image reversal using N-acetylethylenediamine and its acetate salt. Prepare solutions of:

|  | A | B |
|---|---|---|
| N-acetylethylenediamine | 0.22 g | 0.22 g |
| Glycerine | 1 g | 1 g |
| Isopropyl alcohol, 70% | 4 g | 4 g |
| Ethyleneglycol monobutyl ether | 0.22 g | 0.22 g |
| Glycerine | 1 g | 1 g |
| Isopropyl alcohol, 70% | 4 g | 4 g |
| Ethyleneglycol monobutyl ether | 0.4 g | — |
| Acetic acid, 3.4% | — | 2.6 g |

The pH of Solutions A and B are 10.5 and 8.5, respectively. After blanket light exposure of the LASTRA positive plate, apply drops of the two solutions followed by heating the plate at 110° C. for 4 minutes. Excellent images are formed on development where the drops are applied. The non-chemically treated parts of the coating are readily dissolved in the alkaline developer.

EXAMPLE 12

This example illustrates the use of a positive plate in the image reversal process that is made with an o-naphthoquinone-1,2-(diazide-2)-4-sulfonic acid ester. Prepare a solution of:

| ALNOVOL PN-430 | 4.32 g |
|---|---|
| 2,1,4 Diazo Ester D-42 from MRI, CAS# 80296-78-2 | 2.69 g |
| Ethyl Lactate | 44 g |
| Victoria Blue Dye | 0.085 g |
| Sudan M Yellow 150 | 0.070 g |

The solution is coated onto a grained, anodized and silicated aluminum sheet using a number 10 wire wound rod followed by drying with a hot air dryer. Drops of the phosphate salt of MONAZOLINE C which is Solution B of Example 10 is applied onto this plate that is blanket light exposed in the previously described manner followed by heating at 60° C. for both 15 and 30 seconds. Where the drops are applied, the coating is insoluble while the non-chemically treated coating is soluble in the dilute aqueous alkaline developer solution prepared in Example 1. On development, an image forms where the drops are applied and the coating is quantitatively removed in the unimaged areas leaving the hydrophilically treated aluminum bare. This example is the only one that uses a naphthoquinone-1,2-(diazide-2)-4-sulfonic acid ester instead of –5-sulfonic acid esters. Such coatings decarboxylate at lower temperatures both when chemically and non-chemically treated. For example, when the coating prepared in this example is heated at 80° C. for only 30 seconds, it is insolubilized in the developer.

On-press Developable Plate

In another aspect of the invention, the method for preparing an on-press developable plate for printing comprises the steps of:

a) providing an on-press developable plate;
b) applying imagewise an insolubilizing chemical to the plate coating;
c) heating the plate;
d) mounting the plate on the plate cylinder of a conventional offset lithographic press;
e) operating the press such that the press working fluids are applied to the plate coating.

A variety of photopolymer chemistries can be used to create on-press developable coatings for lithographic plates. Often such plate coatings comprise acrylate monomers such as benzyl acrylate, benzyl methacrylate, butoxyethyl acrylate, butoxymethyl methacrylate, cyclohexyl acrylate, cyclohexyl methacrylate, 2-hydroxyethyl acrylate, 2-hydroxyethyl methacrylate, glycidyl acrylate, glycidyl methacrylate, methyl methacrylate, ethyl methacrylate, butyl methacrylate, phenoxyethyl acrylate, phenoxyethyl methacrylate, phenyl methacrylate, ethyleneglycol diacrylate, ethyleneglycol dimethacrylate, diethyleneglycol diacrylate, diethyleneglycol dimethacrylate, triethyleneglycol diacrylate, triethyleneglycol dimethacrylate, tetraethyleneglycol diacrylate, tetraethyleneglycol dimethacrylate, polyethyleneglycol diacrylate, polyethyleneglycol dimethacrylate, neopentylglycol diacrylate, neopentylglycol dimethacrylate, ethyleneglycolbisglycidyl diacrylate, ethyleneglycolbisglycidyl dimethacrylate, trimethylolpropane triacrylate, trimethylolpropane trimethacrylate, glycerol diacrylate, glycerol dimethacrylate, pentaerythritol triacrylate, pentaerythritol tetraacrylate, and pentaerythritol tetramethacrylate. Such plate coatings typically also comprise photoinitiators such as 2,2-dimethoxy-2-phenylacetophenone, benzophenone, benzil and its ketals, ketocoumarin, xanthone, anthraquinones, tris[4-(dimethylamino)phenyl]methane, benzoin, 4,41-bismethoxymethyldiphenylether, and benzoin ethers.

Such plate coatings are well known in the art and are described in U.S. Pat. Nos. 5,514,522; 5,516,620; 5,556,924; 5,599,650; 5,607,816; 5,677,108; 5,677,110; 5,795,698; 5,811,220; 5,997,993; 5,620,822; 5,910,395; 5,925,497; 5,849,462; and 6,027,857 incorporated herein by reference. Commercially available on-press developable plates include the KEMFRE from Spectratech of Wake Forest, N.C., and the most preferred DIRECTPRINT from KPG of Norwalk, Connecticut. The DIRECTPRINT plate coating comprises acrylate monomers such as pentaerythritol triacrylate and free radical photoinitiators such as 2-isopropylthioxanthone (QUANTACURE available from Biddle Sawyer, New York) and tris[4-(dimethylamino)phenyl]methane (Crystal Violet leucobase). The DIRECTPRINT plate coating does not contain substantial carboxylic acid functionality such that an esterification reaction could result in image-worthy insolubilization.

In the invention described hereinabove the plate coatings comprise photosensitive free radical initiators so that the insolubilization reaction can be initiated by light exposure. In another aspect of the invention, a proprietary polymer plate coating can comprise acrylate monomers and free radical initiators as described hereinabove. However, it may be desired to manufacture a proprietary plate coating optimized for the process of imaging by chemical insolubilization. In such a proprietary coating, it would be advantageous to use. nonphotosensitive free radical initiators such as organic or inorganic peroxides or azos so that the user need not be concerned about incidental light exposure. Suitable peroxide initiators include dicumyl peroxide, 2,5-dimethyl-2,5-di(tbutylperoxy)hexane, di-t-butyl peroxide, t-butylperoxy benzoate, 2,5-dimethyl-2,5-di(t-butylperoxy)hexane-3 and lauryl peroxide. Suitable azo free radical initiator compounds include azoisobutyronitrile and dimethylazoisobutyronitrile, and azo-bis-4-cyano-pentoic acid.

As an alternative to using nonphotosensitive free radical initiators, photoinitiators that require co-synergists can be used to produce nonphotosensitive coatings by incorporating only the photoinitiator together with acrylic monomers in a coating. The coating then can be chemically imaged by the imagewise application of a co-synergist that would initiate the polymerization reaction in a subsequent heat treatment step. Illustrative of some such systems are: a 2,4,5-triphenylimidazoyl dimer consisting of two lophine radicals bound together by a single covalent bond as the photoinitiator, and a free radical producing hydrogen donor or an active methylene compound and a p-aminophenyl ketone as co-synergists as described in U.S. Pat. Nos. 3,479,185 and 3,615,567 respectively, incorporated herein by reference, and the use of tertiary amines as co-synergists with thioxanthone photoinitiators as reported in Eur. Polym. J. U.S. Pat. No. 10,841 (1985) incorporated herein by reference.

For photopolymer plates including on-press developable plates such as described above, the insolubilizing agent comprises pH-elevating agents typically of low molecular weight such as sodium carbonate, sodium bicarbonate, lithium carbonate, lithium hydroxide, sodium hydroxide, potassium hydroxide, sodium tetraboratedecahydrate, sodium pyrophosphatedecahydrate, sodium phosphate, sodium metasilicate, or amines such as ethanolamine, diethanolamine, triethanolamine, ethylamine, propylamine, butylamine, imidazolines, substituted imidazolines such as 1-hydroxyethyl-2-cocylimidazoline, 1-hydroxyethyl-2-caprylimidazoline, 1-hydroxyethyl-2-oleylimidazoline, and 1-hydroxyethyl-2-tall oil imidazoline, tall-oil fatty acid-diethylenetriamine imidazoline, imidazoles, substituted imidazoles, amino amides, aromatic amides, polyamines, or mixtures of such chemicals. The insolubilizing agent typically comprises from 0.1 to about 7.5 percent of the fluid. The pH range of the imaging fluid is between 7.5 and 13.5, and more preferably from about 8.0 to 12.5.

A most preferred insolubilizing fluid consists of 1% poly(ethylenimine)(Mw=25,000; Mn=10,000) available from Aldrich, 98.9% water, and 0.1% of the surfactant FS-80 available from Air Products. After imagewise application of the insolubilizing fluid by IJP, it is most preferred to convectively heat the plate for about 60s at about 120 C, taking care not to excessively expose the plate to ambient light. The plate is then ready to be mounted on press, developed according to standard procedure, and used for printing.

Because of their high aqueous solubility and their effectiveness at low concentrations, it is possible to formulate insolubilizing fluids with polyethyleneimines that are both long-term shelf stable and long-term compatible with ink jet printhead materials and components. Without being bound by theory, it is believed that primary and secondary amines such as the polyethyleneimines act as a co-synergists in conjunction with the 2-isopropylthioxanthone photoinitiator of the DIRECTPRINT plate to reduce the thermal stability of the coating in the imaged areas. Thus crosslinking of the plate coating occurs exclusively in the imaged areas during the convective heating step.

The following non-limiting examples serve to further illustrate the invention.

EXAMPLE 13

A marking fluid was mixed with the following components: 98.90 g of distilled water, 1.00 g of poly(ethylenimine)(Mw=25,000; Mn=10,000), and 0.10 g of FS-80 surfactant (Air Products and Chemicals). This solution was injected into an ink cartridge and charged into an Epson 3000 printer. An image was jetted onto a KPG DIRECTPRINT plate, which was then baked in an oven at 230° F. for 3 minutes. The plate was mounted on a rotary offset press, developed according to the manufacturer's instructions and used to print black ink on standard copier paper stock. 900 images were printed with no evidence of plate wear. The image was clean, the lines clear, and the individual image dots were undamaged. Dot diameters on the plate averaged ~54 μm. Dot diameters on paper averaged ~80 μm. Alternatively, a DIRECTPRINT plate so imaged was passed through a convection conveyor oven set at 260° F. for an exposure time of 90 seconds. Press results were similar.

That hundreds of impressions with good image quality can be obtained from a chemically insolubilized negative working PS plate without a baking step after development is a unique and surprising result.

EXAMPLE 14

A marking fluid analogous to that described in Example 13 was mixed, except that the polyethylenimine had a number average molecular weight (Mn) of 600. A KPG DIRECTPRINT plate was processed in the exact same way as in Example 13. This also yielded durable images. when developed on press with black ink; no wear was observed after 100 impressions. The dots on both the plate and the paper were about 25% larger than those in Example 1, and the resulting images were thus much darker.

EXAMPLE 15

A marking fluid was prepared as in Example 13, except that the polyethylenimine had an Mn=423. The plate was imaged with this fluid and then heated in the exact same way as in Example 13. This also yielded durable images when developed on press with black ink. No wear was observed after 100 impressions. The dots on both the plate and the paper were about 25% larger than those in Example 13, and the resulting images were thus much darker. It is believed that the high average molecular weight of the polyethyleneimine polymer in Example 13 inhibits the insolubilizing agent from spreading through the coating during the heating step and thus facilitates the desired small dot size.

EXAMPLE 16

A marking fluid was mixed with the following components: 98.90 g distilled water, 1.00 g pentaethylenehexamine, and 0.10 g FS-80 surfactant. A KPG DIRECTPRINT plate was imaged with this fluid and heated similar to Example 13. This yielded good images when developed on press with black ink. The dot size on the paper was ~100 µm.

EXAMPLE 17

A marking fluid was mixed with the following components: 69.50 g distilled water, 5.00 g glycerine, 25.00 g diethylene glycol, and 0.50 g pentaethylene hexamine. This solution was injected into an ink cartridge and charged into an EPSON 3000 printer. An image was jetted onto a KPG DIRECTPRINT plate, which was then baked at 230° F. for three minutes. The plate was transferred to a rotary offset press, developed according to the manufacturer's directions, and used to print black ink on standard copy paper stock. 100 prints were produced with little or no sign of degraded image wear. This was typical performance of marking fluids employing the lower molecular weight oligomers of ethylenimine.

EXAMPLE 18

Marking fluids were mixed with the following components: 20.00 g distilled water, 1.00 g of ANCAMIDE 50X (X=0, 1, 2, 3, or 7) which are available from Air Products, 2.40 g ethyl lactate, and 0.55 g glycerine. Each of these fluids was pipetted down in small drops on separate areas of a KPG DIRECTPRINT plate, which was then baked at 230° F. for 5 minutes. This plate was transferred to a rotary offset press and used to print black ink on standard copy paper stock. 1000 prints could be generated with little or no sign of degradation or wear of the dots for each of the ANCAMIDE chemicals tested.

EXAMPLE 19

A marking fluid was mixed with the following components: 100.00 g distilled water, 5.00 g of ANCAMIDE 500 (Air Products and Chemicals), 12.00 g ethyl lactate, and 2.75 g glycerine. This solution was used analogously to Example 16 in producing an image on a KPG DIRECT-PRINT plate, which was then baked at 230° F. for 5 minutes, then transferred to a rotary offset press, developed, and used to print black ink on standard copy paper stock. 100 to 300 prints could be produced with little or no sign of degraded image wear. Large dots (>100 µm) were printed on the paper. This experiment was repeated with ANCAMIDES 501, 502, 503, and 507; all resulted in similarly durable images.

EXAMPLE 20

A marking fluid was mixed with the following components: 100.00 g distilled water, 1.00 g MONAZOLINE C (from Uniqema), 12.00 g ethyl lactate, and 2.75 g glycerine. Similar fluids were also mixed with MONAZOLINE O, and MONAZOLINE T in place of the MONAZOLINE C. Each of these fluids was pipetted down in small drops on separate areas of a KPG DIRECTPRINT plate, which was then baked at 225° F. for five minutes. The plate was transferred to a rotary offset press, developed, and used to print black ink on standard copy paper stock. The fluids containing MONAZOLINE C, O and T all produced good images in excess of 100 impressions.

EXAMPLE 21

A marking fluid was mixed with the following components: 87 g distilled water, 1 g MONAZOLINE C, 5 g butyldiglycol, and 7 g glycerine. An image was jetted down onto a KPG DIRECTPRINT plate, which was then baked at 230° F. for three minutes. The plate was transferred to a rotary offset press, developed, and used to print black ink on standard copy paper stock. Images with sharp solids and good dot definition were produced.

Proprietary Plates

In this aspect of the invention, it is not necessary to use a commercially available or presensitized plate. Instead, the only requirement is that the plate has a press-worthy oleophilic coating that is soluble to a developer and that a jettable insolubilizing fluid can be developed for it.

Similar to the embodiment of the invention abovedescribed in which positive plates comprised of quinone diazide sulfonic acid esters and alkali soluble resins are blanket exposed producing carboxylic acids which are then decarboxylated by imagewise application of an insolubilizing fluid according to the invention, it is possible to make a proprietary plate coating comprised of decarboxylatable carboxylic acids and alkali soluble resins but without any expensive o-quinone diazides. Such a coating should have all the desirable features of the positive plates according to the embodiment abovedescribed, but would not be photosensitive and would also have a very long, even unlimited, shelf life. There would also be no need for the abovedescribed blanket exposure step, and because o-quinone diazides are not present, the heating step can be performed at a higher temperature than is possible with commercial positive plates.

The decarboxylation reaction is represented by:

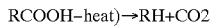

The reaction is favored if R contains electron withdrawing groups, three membered rings adjacent to the carboxyl group and beta, gamma double bonds, and is catalyzed by both acids and bases which can be incorporated in an insolubilizing fluid applied imagewise. Illustrative of the compounds that undergo decarboxylation are depicted in Structures 1–12. The compounds depicted in Structures 1 and 2 are formed by photodecomposition of their corresponding napthoquinone-1,2-(diazide-2)-sulfonic acid esters which are depicted respectively in Structures 13 and 4.

The following non-limiting example serves to further illustrate this aspect of the invention.

EXAMPLE 22

Plate Coating

Prepare a solution of:

| | |
|---|---|
| ALNOVAL PN-430 | 3.2 g |
| 2-Benzoylbenzoic acid (from Aldrich) | 2.1 g |
| Victoria Blue Dye | 0.06 g |
| Sudan M Yellow 150 | 0.06 g |
| Ethyl Lactate | 33 g |

Which is coated onto a grained, anodized, and silicated aluminum sheet using a #10 wire wound rod followed by drying with a hot air dryer.
Insolubilizing Fluid Candidates
Prepare solutions A–E as follows:

| | A | B | C | D | E |
|---|---|---|---|---|---|
| Isopropyl alcohol | — | 2.5 g | 0.5 g | — | — |
| 2-Isopropoxyethanol | — | 2.5 g | 5.0 g | — | — |
| Water | 80 g | 45 g | 33 g | 45 g | 49 g |
| Sulfuric Acid, 96% | 20 g | 5 g | 1 g | — | — |
| 2-Hydroxy-4-methoxybenzophenone-5-sulfonic acid (from Syntase) | — | — | — | 5 g | 1.25 g |
| SURFYNOL 465 | — | — | — | 1 drop | 1 drop |

Drop of solutions A–E were applied onto the coated plate. The plate was then heated at 145° C. for 4 minutes. Upon development with a dilute aqueous solution similar to that described in Example 1, satisfactory images were produced.

If the coating of this example contained typical o-quinone diazides, it would not be possible to heat the plate to 145° C. for a substantial period without fogging (thermally insolubilizing) the plate. Thus a process for chemical insolubilization of a non-photosensitive coating following by a heating step presents unique and surprising advantages.

In another aspect of the invention, it is well known in the art that amines can act as epoxy hardeners. In an embodiment of the invention abovedescribed it is taught how to make a jettable, stable fluid with effective amine hardeners such as the ANCAMIDES and polyethylenimines. Thus according to another aspect of the present invention, it is possible to use such an insolubilizing fluid in conjunction with a plate coating comprised of epoxy monomers.

The following non-limiting example serves to further illustrate the invention.

EXAMPLE 23

1 g of EPSON 1031, 8 g of methylcellosolve, and 3 g isopropyl alcohol were mixed and heated to make a clear solution. EPSON 1031 is a multifunctional epichlorohydrin/tetraphenolethane epoxy resin from Shell Chemicals. The solution was coated onto silicated aluminum plate to create an epoxy emulsion coating.

1% (by weight) aqueous polyethylenimine (Mn=10,000; Mw=25,000) was applied to this emulsion with a pipet in drops. The plate was then heated to 230° F. for one minute and developed with SD- 100 developer (Precision Lithograining), producing an image of the dots that is believed to be due to the cross linking of the epoxy by the polyethylenimine. Similarly it is known that polyamines and polyamine-functionalized compounds can be effective in directly cross linking resins comprising acid anhydrides or isocyanates.

Figure 5:
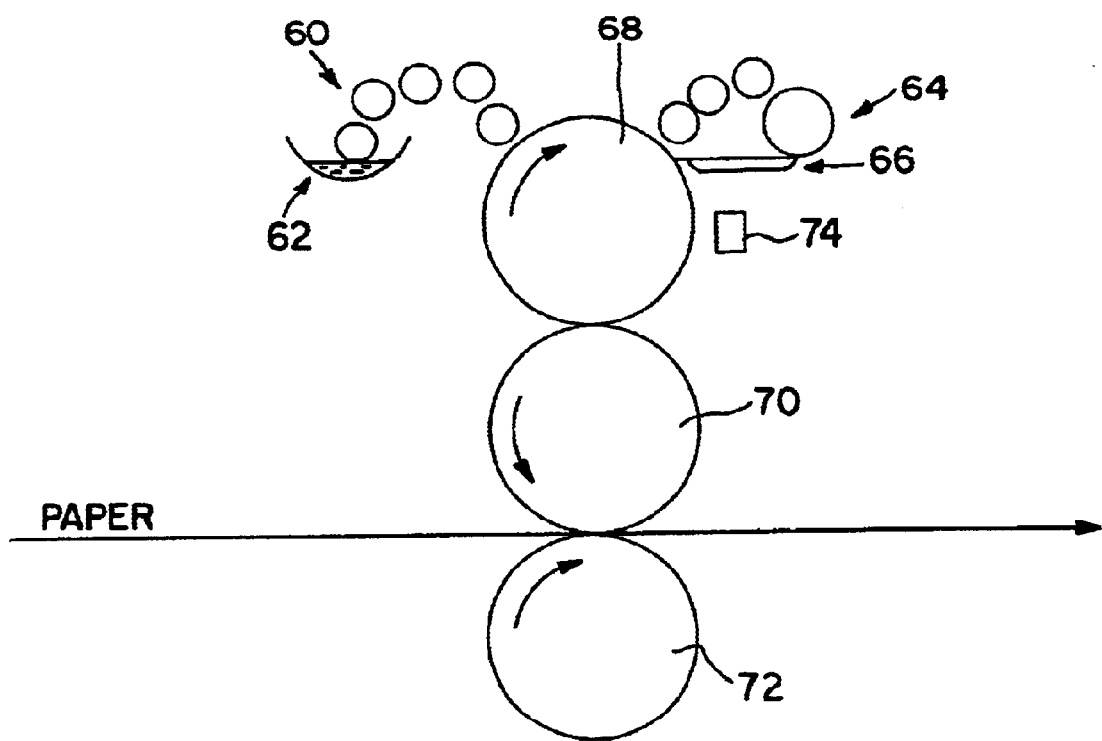
FIG. 5 shows the essential elements of a computer-to-press system comprising an ink jet printhead enabling in situ imaging of a printing plate mounted on press.

In another aspect of the invention, it is possible to incorporate imagewise chemical insolubilization into a computer-to-press system. The essential elements of the press in this embodiment of the invention are shown in FIG. 5. A conventional offset lithographic press has dampening rollers 60 and inking rollers 64, which in normal operation, supply water-based dampening fluid 62 and ink 66 to a printing plate mounted on a plate cylinder 68. In normal printing operation, ink in the form of the image on the plate is transferred to the blanket cylinder 70 and then to the paper that is conveyed through the press via the impression cylinder 72. In this embodiment, an unimaged on-press developable plate is mounted on the plate cylinder 68. It is then imaged with an insolubilizing fluid using an ink jet printhead 74 aligned to the plate cylinder 68. After imaging, if necessary to complete the insolubilization reaction, the plate can be heated in situ (not illustrated). Then the plate can be developed using the working fluids of the press and used in normal printing operation as abovedescribed.

The foregoing is exemplary and not intended to limit the scope of the claims that follow.

We claim:

1. A process for imaging a lithographic printing plate having a presensitizing coating, comprising the steps in sequence of:
   a) blanket exposing said coating; and
   b) imagewise applying droplets of an insolubilizing chemical in a solvent carrier to said coating.

2. The process of claim 1, further comprising the step of heating said coating.

3. The method according to claim 2, wherein the plate is baked to a temperature in the range of 149° C. to 218° C.

4. The method according to claim 2, wherein the plate is baked to a temperature in the range of 149° C. to 177° C.

5. The process of claim 1, wherein said coating comprises an alkali soluble resin.

6. The process of claim 5, wherein said alkali soluble resin comprises a cresol-formaldehyde resin.

7. The process of claim 1, wherein said coating comprises an o-quinone diazide compound.

8. The process of claim 1, wherein said insolubilizing chemical comprises a base.

9. The process of claim 8, wherein said base comprises an N-containing heterocyclic compound.

10. The process of claim 9, wherein said N-containing heterocyclic compound is selected from an imidazoline and an imidazole.

11. The process of claim 10, wherein said imidazoline is selected from the group consisting of cocyl hydroxyethyl imidazoline, capryl hydroxyethyl imidazoline, oleyl hydroxyethyl imidazoline, tall oil hydroxyethyl imidazoline, and tall oil fatty acid-diethylenetriamine.

12. The process of claim 8, wherein said base comprises an inorganic base.

13. The process of claim 1, wherein the insolubilizing chemical has a pH greater than 7.5.

14. The process of claim 1, wherein the insolubilizing chemical is selected from the group consisting of an amine, an amine salt, an amino alcohol, an amino amide, and a base.

15. The process according to claim 1, further comprising a development step (c) to remove non-imaged areas of the coating.

16. The process according to claim 15, wherein the development step employs a developing solution which comprises a decarboxylating chemical selected from the group consisting of an amine, an amine salt, an acid and a base.

17. The method of claim 15, further comprising the step (d) of post baking said plate after imaging and developing.

18. The process of claim 1, wherein the insolubilizing chemical is selected from the group consisting of a quaternary amine and a quaternary imidazoline.

19. The process of claim 18, wherein the quaternary amine or quaternary imidazoline is selected from the group consisting of isostearyl ethylimidonium ethosulfate, cocyl hydroxyethylimidonium acetate, cocyl hydroxyethylimidonium sulphate, cocyl hydroxyethylimidonium phosphate and acetamidoethyleneammonium acetate.

20. A method of imaging a lithographic printing plate having a developable coating comprising a decarboxylatable compound, comprising the step of:

applying imagewise to said coating a chemical which facilitates a decarboxylating reaction such that the imaged coating becomes insoluble to the developer.

21. A subtractive printing plate, comprising:

a) a substrate defining a surface;

b) on the surface, a coating comprising one or more chemicals selected from the group of an acrylate monomer, a diazide, a decarboxylatable carboxylic acid, and a photoinitiator; and c) on said coating, an image covering less than the total coated area defining a chemical comprising an amine functional group.

22. A method of preparing a printing plate having a developable coating, comprising a resin and a cross-linking agent, comprising the step of:

applying imagewise an insolubilizing chemical which when applied to the coating causes the cross-linking agent to cross-link the resin, wherein said insolubilizing chemical is an acid precursor which on heating generates acid.

23. The process of claim 22, wherein said cross-inking agent is 4,4'-bismethoxymethyldiphenylether.

24. The process of claim 22, wherein said resin is a cresol formaldehyde resin.

* * * * *

UNITED STATES PATENT AND TRADEMARK OFFICE
CERTIFICATE OF CORRECTION

PATENT NO. : 6,691,618 B2
DATED : February 17, 2004
INVENTOR(S) : Deutsch et al.

It is certified that error appears in the above-identified patent and that said Letters Patent is hereby corrected as shown below:

<u>Column 9,</u>
Line 59, "30°" should be -- 130° --.
Line 59, "5 seconds" should be -- 15 seconds --.

Signed and Sealed this

Twenty-ninth Day of June, 2004

JON W. DUDAS
*Acting Director of the United States Patent and Trademark Office*